(12) United States Patent
Delgado et al.

(10) Patent No.: US 11,715,622 B2
(45) Date of Patent: Aug. 1, 2023

(54) MATERIAL RECOVERY SYSTEMS FOR OPTICAL COMPONENTS

(71) Applicant: KLA CORPORATION, Milpitas, CA (US)

(72) Inventors: Gildardo Delgado, Livermore, CA (US); Vera (Guorong) Zhuang, San Jose, CA (US); John Savee, San Francisco, CA (US); Evgeniia Butaeva, San Jose, CA (US); Gary V. Lopez Lopez, Sunnyvale, CA (US); Grace Chen, Los Gatos, CA (US)

(73) Assignee: KLA CORPORATION, Milpitas, CA (US)

( * ) Notice: Subject to any disclaimer, the term of this patent is extended or adjusted under 35 U.S.C. 154(b) by 73 days.

(21) Appl. No.: 17/393,932

(22) Filed: Aug. 4, 2021

(65) Prior Publication Data

US 2022/0044905 A1 Feb. 10, 2022

Related U.S. Application Data

(60) Provisional application No. 63/061,188, filed on Aug. 5, 2020.

(51) Int. Cl.
*H01J 37/305* (2006.01)
*H01J 37/20* (2006.01)
*H01J 37/08* (2006.01)

(52) U.S. Cl.
CPC ......... *H01J 37/3053* (2013.01); *H01J 37/08* (2013.01); *H01J 37/20* (2013.01); *H01J 2237/3151* (2013.01); *H01J 2237/3174* (2013.01)

(58) Field of Classification Search
CPC .......... H01J 37/08; H01J 37/10; H01J 37/147; H01J 37/1472; H01J 37/305
See application file for complete search history.

(56) References Cited

U.S. PATENT DOCUMENTS

| 4,757,208 A | 7/1988 | McKenna |
| 2004/0048398 A1 | 3/2004 | Liang |
| 2009/0035586 A1 | 2/2009 | Cangemi |
| 2009/0111036 A1 | 4/2009 | Stewater |
| 2015/0053866 A1* | 2/2015 | Aramaki .................. G21K 1/14 250/423 R |
| 2017/0025241 A1* | 1/2017 | Li .......................... H01J 37/28 |
| 2021/0183615 A1* | 6/2021 | Kamoshida ............. H01J 37/08 |

FOREIGN PATENT DOCUMENTS

WO 03012551 A1 2/2003

OTHER PUBLICATIONS

Search Report regarding corresponding PCT App. No. PCT/2021/044589; dated Dec. 9, 2021.

* cited by examiner

*Primary Examiner* — Eliza W Osenbaugh-Stewart
(74) *Attorney, Agent, or Firm* — Dickinson Wright PLLC

(57) ABSTRACT

A material recovery system for an optical component includes a reservoir containing gas and configured to supply a gas flow containing the gas. The material recovery system also includes an ion beam generator disposed on the reservoir and configured to receive the gas flow and to ionize the gas in the gas flow to generate an ion beam. The ion beam is configured to be directed to the optical component to remove at least a portion of a F-containing optical material degraded by exposure to VUV radiation, DUV radiation, and/or photo-contamination.

16 Claims, 1 Drawing Sheet

MATERIAL RECOVERY SYSTEMS FOR OPTICAL COMPONENTS

CROSS REFERENCE TO RELATED APPLICATIONS

This application claims priority to U.S. Provisional Patent Application 63/061,188, filed Aug. 5, 2020, the content of which is hereby incorporated by reference in its entirety.

TECHNICAL FIELD

The present disclosure relates to material recovery systems for optical components, for example, material recovery systems for fluorine (F)-containing optical materials used in the optical components.

BACKGROUND

F-containing optical materials are commonly used for broadband optical applications and/or systems, ranging from vacuum ultra-violet (VUV) to near-infrared (NIR) optical applications and/or systems. The performance of the F-containing optical materials can be rapidly degraded in VUV and deep ultra-violet (DUV) spectral ranges as a result of photo-contamination and radiation exposure, leading to reduced optical performance and life of the optical applications and/or systems. A method for preventing optical material degradation under high VUV radiation, high DUV radiation, and photo-contamination is desired.

SUMMARY

According to one embodiment, a material recovery system for an optical component having a fluorine (F)-containing optical material which has been exposed to vacuum ultra-violet (VUV) radiation, deep ultra-violet (DUV) radiation and/or photo-contamination is disclosed. The material recovery system may include a reservoir containing a gas and configured to supply a gas flow containing the gas. The material recovery system may further include an ion beam generator disposed on the reservoir and configured to receive the gas flow and to ionize the gas in the gas flow to generate an ion beam. The ion beam may be directed to the optical component to remove at least a portion of the F-containing optical material degraded by VUV radiation, DUV radiation, and/or photo-contamination.

According to another embodiment, a material recovery system is disclosed. The material recovery system may include a reservoir configured to supply a gas flow containing a gas. The material recovery system may further include an ion beam generator disposed on the reservoir and configured to receive the gas flow and to ionize the gas in the gas flow to generate an ion beam. The ion beam may be directed to the optical component to remove a degraded area of optical material of the optical component due to exposure to VUV radiation, DUV radiation, and/or photo-contamination. The material recovery system may also include an extractor disposed between the ion beam generator and the optical component and configured to extract ions from the ion beam generator upon a voltage is applied thereto. The material recovery system may further include a multipole lens disposed between the extractor and the optical component and configured to focus, shape and raster the ion beam. The material recovery system may also include an aperture disposed between the multipole lens and the optical component.

According to yet another embodiment, a method to recover a fluorine (F)-containing optical material of an optical component which is degraded by vacuum ultra-violet (VUV) radiation, deep ultra-violet (DUV) radiation and/or photo-contamination is disclosed. The method may include applying a voltage to an ion beam generator to generate an ion beam. The method may also include directing the ion beam to the optical component to remove the F-containing optical material which is degraded by VUV radiation, deep ultra-violet (DUV) radiation and/or photo-contamination.

DETAILED DESCRIPTION

Figure 1:
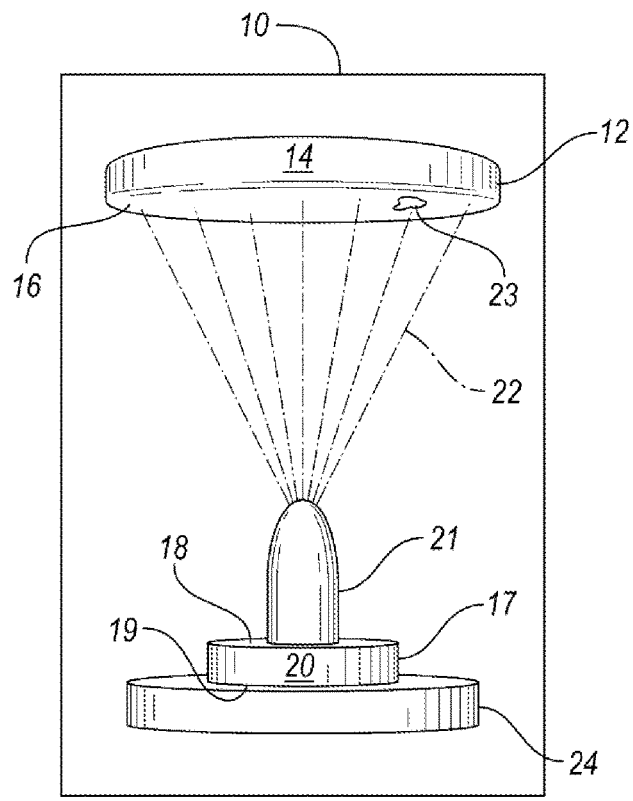
FIG. 1 depicts a schematic diagram of a material recovery system for an optical component according to a first embodiment of the present disclosure.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

One aspect of the present disclosure relates to optical components, and more specifically, materials formed on the optical components. An optical component may include a substrate having an optical surface and a film layer formed on the optical surface, and a protective layer may be deposited on the film layer to protect the optical component from optical damage. Alternatively, an optical component may include a bulk material, and a protective layer may be deposited onto the bulk material to protect the optical component from optical damage or degradation. The optical degradation may be caused by vacuum ultra-violet (VUV) radiation, deep ultra-violet (DUV) radiation and/or photo-contamination. VUV radiation generally refers to UV light with a wavelength in a range of 120 to 190 nm. DUV radiation generally refers to UV light with a wavelength in a range of 190 to 280 nm. Either the film layer or the bulk material may include an optical material which contains fluorine (F), also referred to as a F-containing optical material. Unfortunately, the F-containing optical material may be damaged or degraded by humidity, oxidation, contamination, radiation, and other environmental conditions. Specifically, when the optical component operates under an operation environment (e.g. vacuum containing residual gas or inert atmosphere containing impurities) upon VUV and/or DUV radiation, the F-containing optical material is susceptible to VUV and/or DUV radiation degradation as well as photo-contamination, which consequently deteriorates the optical performance of the optical component and shortens the lifetime of the optical component.

Upon absorption of VUV and/or DUV radiation, fluorine (F) atoms in the F-containing optical material may diffuse or migrate away from their original locations in the F-containing optical material. Some of these F atoms may leave the F-containing optical material. The migration and/or loss of the F atoms may create fluorian vacancy, voids, interstitial F, or the like in the F-containing optical material. The fluorian vacancy, voids, interstitial F, or the like may be considered surface defects or bulk defects that may negatively impact or degrade the optical performance of the optical component. For example, the migration and/or loss of the F atoms may induce either surface or subsurface oxidation of the F-containing optical material, and may also cause oxidation of the film layer when the film layer is deposited onto the optical component. Such oxidations may lead to degradation of the optical performance of the optical component over time. Computational calculations based on the Density Function Theory (DFT) also suggest that it is energetically favorable for oxygen to occupy the fluorian vacancy, which can lead to degradation to the optical performance of the optical component.

Optical components, including those applied in VUV and/or DUV optical applications and/or systems, are expected to have a long durable lifetime, such as ten years or longer. However, due to optical degradation, replacement of a degraded optical component is often required. Such a replacement can be expensive. Therefore, there is a need to recover a degraded optical component in a cost-effective manner.

Aspects of the present disclosure relate to material recovery systems for optical components. The optical component may include a F-containing optical material formed on an optical surface thereof. The F-containing optical material may be degraded by exposure to optical radiation, such as VUV and/or DUV radiation. The F-containing optical material may also be degraded by exposure to photo-contamination. In one embodiment, the present disclosure is directed to a material recovery system which may generate a broad ion beam to remove a F-containing optical material of an optical component that is degraded by VUV radiation, DUV radiation and/or photo-contamination. In another embodiment, the present disclosure is directed to a material recovery system which may generate a focused ion beam to remove a F-containing optical material of an optical component that is degraded by VUV radiation, DUV radiation and/or photo-contamination. In yet another embodiment, the present disclosure is directed to a method to recover a F-containing optical material of an optical component which is degraded by VUV radiation, DUV radiation and/or photo-contamination. The present disclosure may also be applicable to the recovery of other optical material of an optical component that may be degraded by exposure to VUV radiation, DUV radiation and/or photo-contamination, such as other halogens or the like.

Commercially available focused ion beam (FIB) systems are commonly used in the semiconductor industry, material science and increasingly in the biological field for site-specific analysis, deposition, and ablation of materials. For example, FIB systems may use a finely focused beam of ions (e.g. gallium ions, $Ga^+$) for imaging, sputtering or milling purposes. The FIB systems may also be used to etch surfaces of materials or to shape nanoscale materials either by adding atoms to the materials or by shaving them off.

To enhance the capabilities of high-precision optics, an ion beam figuring (IBF) technique has been introduced to treat optical materials. For example, IBF may be used to develop high precision extreme UV (EUV) optics, and some sub-nanometer precision EUV optics that are developed using the IBF technique have been incorporated into lithographic systems. EUV radiation generally refers to extreme UV light that has a wavelength in a range of 11 to 14 nm.

FIG. 1 depicts a schematic diagram of a material recovery system 10 for an optical component 12 according to a first embodiment of the present disclosure. The material recovery system 10 may be an optical material recovery system configured to recover a degraded optical material formed on the optical component 12. The optical component 12 may include a substrate 14 having an optical surface 16. The optical component 12 may further include a protective layer formed on the optical surface 16 to protect the optical surface 16 from optical degradation. Alternatively, the optical component 12 may include a bulk material that protects the optical component 12 from optical degradation. The optical degradation may be caused by VUV radiation, DUV radiation and/or photo-contamination. Either of the protective layer or the bulk material may include a F-containing optical material. The F-containing optical material may be, but is not limited to, magnesium fluoride ($MgF_2$), lanthanum fluoride ($LaF_2$), aluminum fluoride ($AlF_3$), barium fluoride ($BaF_2$), lithium fluoride (LiF), or a combination thereof. The optical component 12 may be, but is not limited to, beam splitters, mirrors, charge-coupled devices (CCDs), detectors, or time delay integration (TDI) CCDs.

Upon exposure to VUV radiation, EUV radiation, and/or DUV radiation, the F-containing optical material of the optical component 12 may degrade due to radiation exposure, including migration and/or loss of the F atoms in the F-containing optical material. The F-containing optical material of the optical component 12 may also suffer photo-contamination, leading to the formation of a hydrocarbon deposition layer onto the optical component 12. The hydrocarbon deposition layer may include contaminants. Such radiation damage as well as photo-contamination may consequently induce an adverse effect on the optical performance of the optical component 12. To recover the F-containing optical material from radiation degradation, especially from VUV and/or DUV radiation damage as well as photo-contamination, an ion beam may be employed to remove any degraded F-containing optical material of the optical component 12, thus preserving the optical performance of the optical component 12.

Referring to FIG. 1, the material recovery system 10 may include a reservoir 17 containing a gas. The reservoir 17 may include a first side 18 (e.g., top side), a second side 19 (e.g., bottom side disposed opposite the top side), and a body 20 extending between the first side 18 and the second side 19. The material recovery system 10 may further include an ion beam generator (e.g. an ion gun) 21 disposed on the reservoir 17, for example, on the first side 18 of the reservoir 17. Upon applying a voltage to the ion beam generator 21, the reservoir 17 may supply a gas flow containing the gas to the ion beam generator 21, where the gas may be ionized to generate an ion beam. The ion beam generator 21 and the reservoir 17 may thus form an ion source.

As shown in FIG. 1, the generated ion beam 22 is a broad (i.e. wide) ion beam which can potentially cover a broad area of the optical surface 16. The broad ion beam may have a diameter of 10 μm to 100 mm. The ion beam 22 may be selectively directed to a degraded area, for example degraded area 23, in the optical material on the optical surface 16 to modify or recover material of the optical component. The ion beam 22 may strike the degraded area with sufficient kinetic energy (e.g., about 1000 eV) to sputter the degraded area. In some embodiments, the ion beam 22 may sputter the degraded area layer-by-layer in a controlled manner, where the energy of the striking ions may be transferred to the atoms at the degraded area to remove the degraded optical material. In other embodiments, the ion beam 22 may sputter the photo-contamination layer-by-layer in a controlled manner, where the energy of the striking ions may be transferred to the hydrocarbon deposition layer formed at the contaminated area on the optical component 12 to remove the contaminants. Such a material removal process is referred to as dry etching. An etching rate of the degraded area 23 may depend on a current density of the ion beam 22 and/or an energy of the ion beam 22. By adjusting the current density and/or energy of the ion beam 22, the amount of the degraded optical material to be removed can be controlled.

Because the ion beam 22 is selectively directed to the degraded area in the optical material, the remaining area (i.e., area without degradation) of the optical material remains unchanged. To achieve a better control of the material removal process, an impinging angle of the ion beam 22 with respect to the optical surface 16 may be adjusted such that an ion penetration depth of the ion beam 22 into the optical surface 16 can be controlled. In some embodiments, the degraded area may include more than one layer of the optical material that suffers from radiation degradation (e.g., VUV and/or DUV radiation degradation) and/or photo-contamination. As such, upon directing the ion beam 22 to the degraded area, at least a portion of the degraded area of the optical material may be removed layer-by-layer.

To control the intensity of the ion beam 22, the material recovery system 10 may adjust the voltage applied to the ion beam generator 21 and/or control the gas flow supplied by the reservoir 17 to the ion beam generator 21. In addition, an optical lens may be disposed between the optical component 12 and the ion beam generator 21 to control the current density of the ion beam 22.

In some embodiments, the gas contained in the reservoir 17 may be an inert gas, such as argon (Ar), which can be ionized to generate an ion beam containing ions, such as $Ar^+$ ions. Ar is routinely used as a purge gas in VUV and/or DUV optical applications and/or systems. In some other embodiments, the gas contained in the reservoir 17 may be a F-containing gas, such as nitrogen trifluoride ($NF_3$), hydrogen trifluoride ($HF_3$) or xenon difluoride ($XeF_2$), which can be ionized to generate an ion beam containing ions, such as $F^+$ ions. Using $F^+$ ions may be beneficial because a F-containing ion beam may not only etch away the degraded optical material, but also supply additional $F^+$ ions to the degraded area. The additional $F^+$ ions may reoccupy the fluorian vacancy in the degraded area in which F atoms are caused to migrate and/or leave from the optical material as a result of radiation damage (e.g., VUV and/or DUV radiation damage). In some embodiments, the $F^+$ ions may bond to dangling bonds (i.e. broken bonds) in the degraded area, thereby repairing the degraded area and recovering the F-containing optical material on the optical surface 16 of the optical component 12.

To better control the direction of the generated ion beam 22, the material recovery system 10 of FIG. 1 may further include an XYZ stage 24 removably coupled to the second side 19 of the reservoir 17 (i.e., the ion source of FIG. 1 may be placed on the XYZ stage 24) and spaced apart from the ion beam generator 21. The XYZ stage 24 may be a motorized positioning stage controllable with motion controllers using computers, and may provide multi-axis motion in three degrees of freedom. By incorporating the XYZ stage 24, the direction of the ion beam 22 may be altered based on a specific location of the degraded area in the optical material, and therefore, promotes the efficiency of the material recovery system 10.

The optical surface 16 of the optical component 12 shown in FIG. 1 appears to be flat. However, the optical surface 16 may have other surface shapes and/or curvatures. In some embodiments, the optical surface 16 may be aspherical. In some other embodiments, the optical surface 16 may be partially spherical to define a radius of curvature. In yet some other embodiments, the optical surface 16 may be asymmetrical (e.g., an irregular shape). In still yet some other embodiments, the optical surface 16 may be graded (e.g., thickness gradient across the optical surface 16). Regardless of the shapes and/or curvatures of the optical surface 16, the material recovery system 10 may be used to recover any radiation damage in the optical material of the optical component 12, including radiation damage caused by VUV and/or DUV radiation. The material recovery system 10 may achieve a root mean square (RMS) value of surface figure of less than 0.2 nm when the optical component 12 is characterized with a radiation wavelength of 633 nm, for example.

To safely preserve the optical component 12 in its pristine state or to protect the optical surface 16 of the optical component 12 from any potential radiation degradation (e.g., due to exposure to VUV or DUV radiation) and/or photo-contamination, a sacrificial layer may be preemptively formed on the optical surface 16. For example, a sacrificial layer may be formed on top of the protective layer or the bulk material of the optical component 12 before the optical component 12 is put into use (e.g., during transportation of the optical component 12 or before the optical component 12 is installed in an optical application and/or system). The sacrificial layer may include a sacrificial material. The sacrificial material may be, but is not limited to, polysilicon or silicon oxide films. The sacrificial material may be removed using the ion beam 22 when the optical component 12 is removed from a safe environment or when the optical component 12 is installed in an optical application and/or system. In some embodiments, the safe environment may refer to an environment without—or with a minimal risk of—optical degradation, such as due to exposure to VUV and/or DUV radiation. In some other embodiments, the safe environment may refer to an environment without—or with a minimal risk of—photo-contamination. In yet some other embodiments, the safe environment may refer to a vacuum environment. In still yet some other embodiments, the safe environment may refer to a purified inert gas environment.

A method to recover the degraded optical material formed on the optical component 12 according to FIG. 1 is described. The method may include applying a voltage to the ion beam generator 21 to generate the ion beam 22. The method may also include directing the ion beam 22 to the optical component 12 to repair the F-containing optical material which is degraded by VUV radiation, DUV radiation and/or photo-contamination. The ion beam 22 may be a broad ion beam. The broad ion beam may have a diameter of 10 μm to 100 mm. The method may further include placing an optical lens between the optical component 12 and the ion beam generator 21 to control a current density of the ion beam 22.

Figure 2:
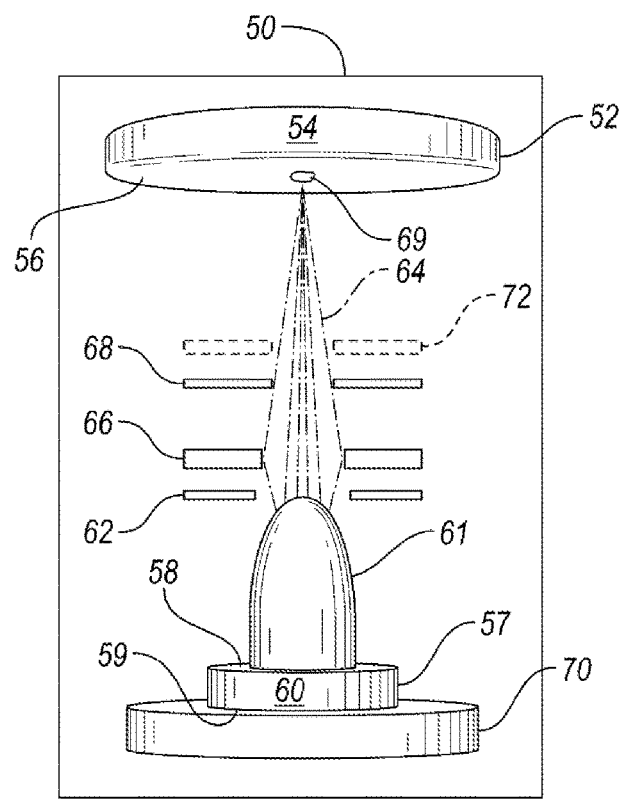
FIG. 2 depicts a schematic diagram of a material recovery system for an optical component according to a second embodiment of the present disclosure.

FIG. 2 depicts a schematic diagram of a material recovery system 50 for an optical component 52 according to a second embodiment of the present disclosure. The material recovery system 50 may be an optical material recovery system configured to recover a degraded optical material formed on the optical component 52. The optical component 52 may include a substrate 54 having an optical surface 56. The optical component 52 may further include a protective layer formed on the optical surface 56 to protect the optical surface 56 from optical damage. Alternatively, the optical component 52 may include a bulk material that protects the optical surface 56 from optical damage. The optical degradation may be caused by VUV radiation, DUV radiation and/or photo-contamination. Either the protective layer or the bulk material may include a F-containing optical material. The F-containing optical material may be, but is not limited to, $MgF_2$, $LaF_2$, $AlF_3$, $BaF_2$, LiF, or a combination thereof. The optical component may be, but is not limited to, beam splitters, mirrors, charge-coupled devices (CCDs), detectors, or time delay integration (TDI) CCDs.

Upon exposure to VUV and/or DUV radiation, the F-containing optical material of the optical component 52 may undergo degradation, including migration and/or loss of the F atoms in the F-containing optical material. The F-containing optical material of the optical component 52 may also suffer photo-contamination, leading to the formation of a hydrocarbon deposition layer onto the optical component 52. The hydrocarbon deposition layer may include contaminants. Such radiation exposure as well as photo-contamination may consequently induce an adverse effect on the optical performance of the optical component 52. To recover the degraded F-containing optical material, especially from exposure to VUV and/or DUV radiation as well as photo-contamination, an ion beam may be employed to remove any degraded F-containing optical material, thus preserving or improving the optical performance of the optical component 52.

Referring to FIG. 2, the material recovery system 50 may include a reservoir 57 containing a gas. The reservoir 57 may include a first side 58 (e.g., top side), a second side 59 (e.g., bottom side disposed opposite the top side), and a body 60 extending between the first side 58 and the second side 59. The material recovery system 50 may further include an ion beam generator (e.g. an ion gun) 61 disposed on the reservoir 57, for example, on the first side 58 of the reservoir 57. Upon applying a voltage to the ion beam generator 61, the reservoir 57 may supply a gas flow containing the gas to the ion beam generator 61, where the gas may be ionized to generate an ion beam. The ion beam generator 61 and the reservoir 57 may thus form an ion source. The material recovery system 50 may also include an extractor 62 disposed between the ion beam generator 61 and the optical component 52. The extractor 62 is configured to extract ions from the ion beam generator 61 when a voltage is applied thereto. The level of voltage applied to the extractor 62 may influence the amount of ions that are extracted from the ion beam generator 61, which in turn determines the intensity of the ion beam 64 generated therefrom.

As shown in FIG. 2, the generated ion beam 64 is a focused ion beam. The focused ion beam 64 may be used to scan the degraded area in the optical material in a form of a focused spot. To generate the focused ion beam 64, the material recovery system 50 may include a multipole lens 66 disposed between the extractor 62 and the optical component 52. In some embodiments, the multipole lens 66 is an octupole lens, which may focus, shape and raster the focused ion beam 64. The material recovery system 50 may also include an aperture 68 disposed between the multipole lens 66 and the optical component 52. The aperture 68 may include a shape and a size. In FIG. 2, the aperture is shown to reduce the size of the ion beam 64 passing there through, thereby assisting in focusing the ion beam 64.

Referring to FIG. 2, the focused ion beam 64 may be selectively directed to a degraded area, for example, degraded area 69, in the optical material on the optical surface 56. The focused ion beam 64 may strike the degraded area with sufficient kinetic energy (e.g., about 1000 eV) to sputter the degraded area. In some embodiments, the focused ion beam 64 may sputter the degraded area layer-by-layer in a controlled manner, where the energy of the striking ions may be transferred to the atoms at the degraded area to remove the degraded optical material. In some other embodiments, the focused ion beam 64 may sputter the photo-contamination layer-by-layer in a controlled manner, where the energy of the striking ions may be transferred to the hydrocarbon deposition layer formed at the contaminated area on the optical component 52 to remove the contaminants. Such a material removal process is referred to as dry etching. An etching rate of the degraded area may depend on a current density of the focused ion beam 64 and/or an energy of the ion beam 22. By adjusting the current density and/or energy of the ion beam 64, the amount of the degraded optical material and contaminants to be removed can be controlled.

Because the ion beam 64 is selectively directed to the degraded area in the optical material, the remaining area (i.e., area without degradation) of the optical material remain unchanged. To achieve a better control of the material removal process, an impinging angle of the ion beam 64 with respect to the optical surface 56 may be adjusted such that an ion penetration depth of the ion beam 64 into the optical surface 56 can be controlled. In some embodiments, the degraded area may include more than one layer of the optical material that suffers from radiation degradation (e.g., VUV and/or DUV radiation) and/or photo-contamination. As such, upon directing the ion beam 64 to the degraded area, the degraded optical material may be removed layer-by-layer.

To control the intensity of the focused ion beam 64, the material recovery system 50 may adjust the voltage applied to the ion beam generator 61 and/or the extractor 62. The material recovery system 50 may also control the gas flow supplied by the reservoir 57 to the ion beam generator 61. In addition, an optical lens 72 may be disposed between the optical component 52 and the ion beam generator 61 to control the current density of the ion beam 64. The illustrated location of the optical lens 72 shown in FIG. 2 is merely provided as one example. It is contemplated that the optical lens 72 may be located anywhere between the optical component 52 and the ion beam generator 61. For example, the optical lens 72 may be disposed between the optical component 52 and the aperture 68. For another example, the optical lens 72 may be disposed between the aperture 68 and the multipole lens 66. For still another example, the optical lens 72 may be disposed between the multipole lens 66 and the extractor 62.

In some embodiments, the gas contained in the reservoir 57 may be an inert gas, such as argon (Ar), which can be ionized to generate an ion beam containing ions, such as $Ar^+$ ions. Ar is routinely used as a purge gas in VUV and/or DUV optical applications and/or systems. In some other embodiments, the gas contained in the reservoir 57 may be a F-containing gas, such as $NF_3$, $HF_3$ or $XeF_2$, which can be ionized to generate an ion beam containing ions, such as $F^+$ ions. Using F⁺ ions may be beneficial because a F-containing ion beam may not only etch away the degraded optical material but also supply additional F⁺ ions to the degraded area. The additional F⁺ ions may reoccupy the fluorian vacancy in the degraded area in which F atoms are caused to migrate and/or leave from the optical material as a result of radiation damage (e.g., VUV and/or DUV radiation damage). In some embodiments, the F⁺ ions may bond to dangling bonds (i.e., broken bonds) in the degraded area, thereby repairing the degraded area damage and recovering the F-containing optical material on the optical surface 56 of the optical component 52.

To better control the direction of the generated focused ion beam 64, the material recovery system 50 of FIG. 2 may further include an XYZ stage 70 removably coupled to the second side 59 of the reservoir 57 (i.e., the ion source of FIG. 2 may be placed on the XYZ stage 70). The XYZ stage 70 may be a motorized positioning stage controllable with motion controllers using computers, and may provide multi-axis motion in three degrees of freedom. By incorporating the XYZ stage 70, the direction of the focused ion beam 64 may be altered based on a specific location of the degraded area in the optical material, and therefore, promoting the efficiency of the material recovery system 50. In addition to the XYZ stage 70, the extractor 62, the multipole lens 66 and the aperture 68 may also be used to raster the focused ion beam 64.

The optical surface 56 of the optical component 52 shown in FIG. 2 appears to be flat. However, the optical surface 56 may have other surface shapes and/or curvatures. In some embodiments, the optical surface 56 may be aspherical. In some other embodiments, the optical surface 56 may be spherical. In yet some other embodiments, the optical surface 56 may be asymmetrical (e.g., an irregular shape). In still yet some other embodiments, the optical surface 56 may be graded (e.g., thickness gradient across the optical surface 56). Regardless of the shapes and/or curvatures of the optical surface 56, the material recovery system 50 may be used to recover any radiation damage in the optical material of the optical component 52, including radiation damage caused by VUV and/or DUV radiation. The material recovery system 50 may achieve a root mean square (RMS) value of surface figure of less than 0.2 nm when the optical component 52 is characterized with a radiation wavelength of 633 nm.

To safely preserve the optical component 52 in its pristine state or to protect the optical surface 56 of the optical component 52 from any potential radiation damage (e.g., VUV radiation damage), a sacrificial layer may be preemptively formed on the optical surface 56. For example, a sacrificial layer may be formed on top of the protective layer or the bulk material of the optical component 52 before the optical component 52 is put into use (e.g., during transportation of the optical component 52 or before the optical component 52 is installed in an optical application and/or system). The sacrificial layer may include a sacrificial material. The sacrificial material may be, but is not limited to, polysilicon or silicon oxide films. The sacrificial material may be removed using the focused ion beam 64 when the optical component 52 is removed from a safe environment or when the optical component 52 is installed in an optical application and/or system. In some embodiments, the safe environment may refer to an environment without—or with a minimal risk of—radiation damage, such as VUV and/or DUV radiation damage. In some other embodiments, the safe environment may refer to an environment without—or with a minimal risk of—photo-contamination. In yet some other embodiments, the safe environment may refer to a vacuum environment. In still yet some other embodiments, the safe environment may refer to a purified inert gas environment.

A method to recover the degraded optical material formed on the optical component 52 according to FIG. 2 is described. The method may include applying a voltage to the ion beam generator 61 and/or the extractor 62 to generate an ion beam 64. The method may also include directing the ion beam 64 to the optical component 52 to remove the F-containing optical material which is degraded by VUV radiation, DUV radiation and/or photo-contamination. The ion beam 64 may be a focused ion beam. The method may further include placing an optical lens (i.e., in addition to the multipole lens 66) between the optical component 52 and the ion beam generator 61 to control a current density of the ion beam 64. The optical lens may be a lens other than the multipole lens, while in other embodiments the optical lens may also be a multipole lens.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A material recovery system for an optical component having a fluorine (F)-containing optical material which has been exposed to vacuum ultra-violet (VUV) radiation, deep ultra-violet (DUV) radiation and/or photo-contamination, the material recovery system comprising:
   a reservoir containing a gas and configured to supply a gas flow containing the gas, wherein the gas contains fluorine; and
   an ion beam generator disposed on the reservoir and configured to receive the gas flow and to ionize the gas in the gas flow to generate an ion beam, the ion beam configured to be directed to the optical component to remove at least a portion of the F-containing optical material degraded by exposure to VUV radiation, DUV radiation, and/or photo-contamination.

2. The material recovery system of claim 1, wherein the F-containing optical material is selected from the group consisting of magnesium fluoride ($MgF_2$), lanthanum fluoride ($LaF_2$), aluminum fluoride ($AlF_3$), barium fluoride ($BaF_2$), lithium fluoride (LiF), and a combination thereof.

3. The material recovery system of claim 1, wherein the ion beam has a diameter of 10 µm to 100 mm.

4. The material recovery system of claim 1, further comprising an XYZ stage removably coupled to the reservoir and spaced apart from the ion beam generator, the XYZ stage being configured to alter a direction of the ion beam based on a location of the portion of the F-containing optical material degraded by exposure to VUV radiation, DUV radiation, and/or photo-contamination.

5. The material recovery system of claim 1, further comprising an optical lens disposed between the optical component and the ion beam generator to control a current density of the ion beam.

6. The material recovery system of claim 1, wherein the optical component further includes a sacrificial layer formed on the optical component and removable using the ion beam.

7. A material recovery system comprising:
- a reservoir configured to supply a gas flow containing a gas, wherein the gas contains fluorine;
- an ion beam generator disposed on the reservoir and configured to receive the gas flow and to ionize the gas in the gas flow to generate an ion beam, the ion beam configured to be directed to an optical component to remove a degraded area of an optical material of the optical component due to exposure to VUV radiation, DUV radiation, and/or photo-contamination;
- an extractor disposed between the ion beam generator and the optical component and configured to extract ions from the ion beam generator when a voltage is applied thereto;
- a multipole lens disposed between the extractor and the optical component and configured to focus, shape and raster the ion beam; and
- an aperture disposed between the multipole lens and the optical component.

8. The material recovery system of claim 7, wherein the optical material is a F-containing optical material selected from the group consisting of $MgF_2$, $LaF_2$, $AlF_3$, $BaF_2$, LiF, and a combination thereof.

9. The material recovery system of claim 7, wherein the multipole lens is an octupole lens.

10. The material recovery system of claim 7, further comprising an XYZ stage removably coupled to the reservoir and spaced apart from the ion beam generator, the XYZ stage being configured to alter a direction of the ion beam based on a location of the degraded area.

11. The material recovery system of claim 7, further comprising an optical lens disposed between the optical component and the ion beam generator to control a current density of the ion beam.

12. The material recovery system of claim 7, wherein the optical component further includes a sacrificial layer formed on the optical component and removable using the ion beam.

13. A method to recover a fluorine (F)-containing optical material of an optical component which is degraded by exposure to vacuum ultra-violet (VUV) radiation, deep ultra-violet (DUV) radiation and/or photo-contamination, the method comprising:
- applying a voltage to an ion beam generator to generate an ion beam; and
- directing the ion beam to the optical component to remove the F-containing optical material which is degraded by exposure to VUV radiation, deep ultra-violet (DUV) radiation and/or photo-contamination.

14. The method of claim 13, wherein the F-containing optical material is selected form the group consisting of $MgF_2$, $LaF_2$, $AlF_3$, $BaF_2$, LiF, and a combination thereof.

15. The method of claim 13, wherein the ion beam includes argon ions or fluorine ions.

16. The method of claim 13, wherein the method further includes placing an optical lens between the optical component and the ion beam generator to control a current density of the ion beam.

* * * * *